(12) United States Patent
Higashitani et al.

(10) Patent No.: US 9,125,315 B2
(45) Date of Patent: Sep. 1, 2015

(54) CONDUCTIVE FILM AND METHOD FOR ITS PRODUCTION

(75) Inventors: Ko Higashitani, Kyoto (JP); Yasuhiro Tsudo, Kyoto (JP); Masaki Nakayama, Yokohama (JP); Shinji Kake, Yokohama (JP)

(73) Assignees: Kyoto University, Kyoto-shi (JP); SANYO CHEMICAL INDUSTRIES, LTD., Kyoto-shi (JP); Mitsubishi Rayon Co., Ltd., Tokyo (JP)

( * ) Notice: Subject to any disclaimer, the term of this patent is extended or adjusted under 35 U.S.C. 154(b) by 396 days.

(21) Appl. No.: 13/574,073

(22) PCT Filed: Jan. 18, 2011

(86) PCT No.: PCT/JP2011/050774
§ 371 (c)(1),
(2), (4) Date: Sep. 5, 2012

(87) PCT Pub. No.: WO2011/090034
PCT Pub. Date: Jul. 28, 2011

(65) Prior Publication Data
US 2012/0325545 A1  Dec. 27, 2012

(30) Foreign Application Priority Data

Jan. 19, 2010 (JP) .................................. 2010-008998
Jul. 28, 2010 (JP) .................................. 2010-169535

(51) Int. Cl.
*H05K 1/09* (2006.01)
*H05K 3/12* (2006.01)
(Continued)

(52) U.S. Cl.
CPC ................ *H05K 3/1216* (2013.01); *H01B 1/02* (2013.01); *H05K 1/092* (2013.01); *H05K 9/0094* (2013.01)

(58) Field of Classification Search
CPC ..... H05K 1/0266; H05K 1/0269; H05K 1/092; H05K 1/095; H05K 3/1216; H05K 3/1275
USPC ............................. 174/255, 261; 29/830, 840
See application file for complete search history.

(56) References Cited

U.S. PATENT DOCUMENTS

2004/0150326 A1  8/2004  Shibata
2006/0292721 A1  12/2006  Chae et al.
(Continued)

FOREIGN PATENT DOCUMENTS

CN         1888953 A      1/2007
CN         102741945 A    10/2012
(Continued)

OTHER PUBLICATIONS

International Search Report Issued Mar. 29, 2011 in PCT/JP11/50774 Filed Jan. 18, 2011.
(Continued)

*Primary Examiner* — Jeremy C Norris
(74) *Attorney, Agent, or Firm* — Oblon, McClelland, Maier & Neustadt, L.L.P.

(57) ABSTRACT

To provide a method for producing a conductive film with excellent transparency and conductivity by a simple method suitable for large-area production.
A method for producing a conductive film comprising a step of placing a template (B), having openings in a mesh structure running from the side that is to contact a substrate (A) through to the back side, on the surface of the substrate (A), and spreading a dispersion (D) of conductive particles (P) on the surface of the substrate (A) on which the template (B) has been placed, and drying it, thereby forming a mesh-like structure (C) of the conductive particles (P) near the points of contact between the substrate (A) and the template (B), and then removing the template (B) from the substrate (A) to form a mesh-like structure (C) of the conductive particles (P) on the surface of the substrate (A).

12 Claims, 10 Drawing Sheets

(51) Int. Cl.
*H05K 9/00* (2006.01)
*H01B 1/02* (2006.01)

(56) References Cited

U.S. PATENT DOCUMENTS

2009/0087800 A1* 4/2009 Nakahira et al. ............... 430/325
2009/0183901 A1* 7/2009 Kataoka et al. ............... 174/257

FOREIGN PATENT DOCUMENTS

| | | |
|---|---|---|
| JP | 11 26980 | 1/1999 |
| JP | 2001 332134 | 11/2001 |
| JP | 2003 46293 | 2/2003 |
| JP | 2003 151363 | 5/2003 |
| JP | 2003 266583 | 9/2003 |
| JP | 2003 331654 | 11/2003 |
| JP | 2004 55363 | 2/2004 |
| JP | 2004 228057 | 8/2004 |
| JP | 2004 296424 | 10/2004 |
| JP | 2008 27636 | 2/2008 |
| JP | 2008 41445 | 2/2008 |
| JP | 2008-47655 | 2/2008 |
| JP | 2009 16700 | 1/2009 |
| JP | 2009-99541 | 5/2009 |
| KR | 10-2008-0111845 | 12/2008 |
| WO | 2007 043569 | 4/2007 |

OTHER PUBLICATIONS

Office Action issued Aug. 12, 2013 in Korean Patent Application No. 10-2012-7018206.
Bok Y. Ahn, et al. "Omnidirectional Printing of Flexible, Stretchable, and Spanning Silver Microelectrodes," Science (www.sciencemag.org), vol. 323, 24 pages, Mar. 20, 2009.
Combined Office Action & Search Report issued Sep. 26, 2013 in Chinese Application No. 201180006563.6 (With English Translation of Category of Cited Documents).
Combined Taiwanese Office Action and Search Report issued Dec. 3, 2015 in Patent Application No. 10010196 (with English translation of categories of cited documents).
Japan Office Action issued Jun. 23, 2015, in corresponding Japan Patent Application No. 2011-505297.

\* cited by examiner

CONDUCTIVE FILM AND METHOD FOR ITS PRODUCTION

This application is a 371 of PCT/JP11/50774, filed Jan. 18, 2011. Priority to Japanese patent application 2010-008998, filed Jan. 19, 2010; and Japanese patent application 2010-169535, filed Jul. 28, 2010, are claimed.

TECHNICAL FIELD

The present invention relates to a conductive film with excellent transparency and conductivity, and to a method for its production.

BACKGROUND ART

Conductive films with excellent transparency are widely used for such purposes as display electrodes for flat panel displays such as plasma displays and liquid crystal displays; transparent electrodes for touch panels; transparent electrodes for solar cells; and electromagnetic wave shielding films.

Tin-doped indium oxide (Indium Tin Oxide, hereunder referred to as "ITO") is well known as a material for forming conductive films with excellent transparency. ITO films are produced by gas phase methods such as sputtering or vacuum vapor deposition, but gas phase methods require high vacuum apparatuses and large equipment investment. The equipment investment and maintenance cost becomes particularly immense for purposes that require large-sized areas. Furthermore, since the component gas pressure in the production apparatus must be precisely controlled for production of each ITO film, this affects the production cost and productivity.

One method for solving this problem is a method of forming an ITO film by coating an ITO fine particle dispersion and drying it (PTL 1). However, ITO films are associated with numerous problems that must be overcome, such as the high cost of indium, difficulty of increasing conductivity while maintaining transparency, and susceptibility to bending.

Development of conductive films that employ conductive materials instead of ITO has been advancing in recent years. Notably, methods of forming mesh-like or other patterns with dispersions of metal fine particles or extra fine wires in solution, by screen printing, ink jet printing or utilizing a self-organization phenomenon, have been proposed (Patent documents 2-6).

In printing methods, however, productivity is reduced due to clogging of the mesh or nozzle, and it is difficult to form intricate patterns with line widths of less than 6 μm. Patterns with approximately 2 μm widths have reportedly been formed by ink jet printing, but very long time periods are necessary due to the small coating amounts used, and such methods are therefore poorly suitable for industrial-scale production. Moreover, with a self-organization phenomenon, which utilizes hydrophilic/hydrophobic interaction between the substrate and solution, this prohibits free selection of the substrate and complicates control of the pattern shape.

Photolithographic methods and methods employing electrodeposited meshes have also been proposed.

In one of the proposed photolithographic methods, a copper foil is attached to a transparent base and photolithography is employed for etching (PTL 7). This method allows fine processing to produce a mesh with a high open area ratio (high transmittance), while the conductivity is also high. However, photolithographic methods are essentially utilized for processing of small-sized areas and are not easily adaptable for large areas.

Methods using electrodeposited meshes have been proposed in which a mesh-like metal electrodeposition layer having a metal electrolyte solution electrodeposited on an electrodeposition substrate is bonded and transferred to a transparent base (PTL 8). PTL 8 discloses a mesh with a line width of 30 μm. This method produces an easily recognizable thick line-width mesh form. However, it cannot easily produce fine line widths.

Thus, a conductive film with a metal mesh on the surface, produced by prior art technology, has relatively high conductivity but has been problematic in terms of either fine pattern formation or large-area sizes.

CITATION LIST

Patent Literature

[PTL 1] Japanese Unexamined Patent Publication No. 2001-332134
[PTL 2] Japanese Unexamined Patent Publication No. 2004-55363
[PTL 3] Japanese Unexamined Patent Publication No. 2003-266583
[PTL 4] Japanese Unexamined Patent Publication No. 2009-16700
[PTL 5] Japanese Unexamined Patent Publication No. 2004-296424
[PTL 6] Japanese Unexamined Patent Publication No. 2008-41445
[PTL 7] Japanese Unexamined Patent Publication No. 2003-46293
[PTL 8] Japanese Unexamined Patent Publication HEI No. 11-26980

DISCLOSURE OF THE INVENTION

Problems to be Solved by the Invention

It is an object of the invention to provide a method for producing a conductive film with excellent transparency and conductivity by a simple method suitable for large-area production.

Means for Solving the Problems

As a result of much diligent research with the aim of obtaining such a conductive film, the present inventors have found that by placing a template with the same shape as the pattern that is to be formed on a substrate surface, spreading a dispersion comprising a conductive material such as a metal, on the substrate surface, and drying the dispersing medium, a pattern with the same shape as the template is formed on the substrate surface with a finer line width than the template line width. It was also found that the formed pattern can be easily transferred to a substrate such as a film by a transfer method, and the present invention was thus completed.

Specifically, the invention is a method for producing a conductive film comprising a step of placing a template (B), having openings in a mesh structure running from the side that is to contact a substrate (A) through to the back side, on the surface of the substrate (A), and spreading a dispersion (D) of conductive particles (P) on the surface of the substrate (A) on which the template (B) has been placed, and drying it, thereby forming a mesh-like structure (C) of the conductive particles (P) near the points of contact between the substrate (A) and the template (B), and then removing the template (B)

from the substrate (A) to form a mesh-like structure (C) of the conductive particles (P) on the surface of the substrate (A).

The invention is also the aforementioned method for producing a conductive film further comprising, after formation of the mesh-like structure (C) of the conductive particles (P) on the surface of the substrate (A), a step of forming a resin layer on the surface of the substrate (A) and placing a substrate (E) thereover, and then releasing the substrate (A) to transfer the mesh-like structure (C) of the conductive particles (P) onto the surface of the substrate (E).

The invention is also a conductive film having a fine pattern formed by a conductor on a substrate surface, the conductive film having the following features (a) to (c).
(a) The fine pattern has a mesh structure.
(b) The line width of the fine pattern is 0.5-6 µm.
(c) The shape of the cross-section of the thin wires of the fine pattern has a segment structure that traces an ascending arc.

Effect of the Invention

The production method of the invention is a method that allows large-area formation of conductive films with excellent transparency and conductivity by a simple process, and therefore its industrial value is high.

Since the conductive film of the invention has excellent transparency and conductivity and can be produced in a simple manner, its industrial value is high.

BEST MODE FOR CARRYING OUT THE INVENTION

Figure 1:
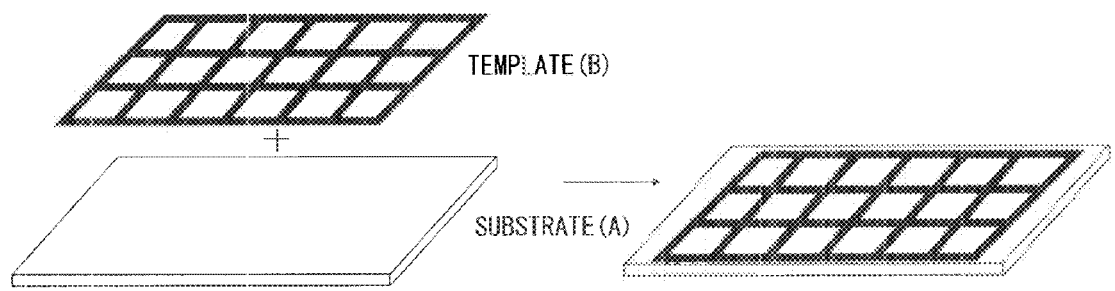
FIG. 1 is a schematic perspective view showing the step of placing a template (B) on a substrate (A).

The method for producing a conductive film according to the invention will now be explained.

The conductive film of the invention can be produced by including a step of placing a template (B), having openings in a mesh structure running from the side that is to contact a substrate (A) through to the back side, on the surface of the substrate (A), and spreading a dispersion (D) of conductive particles (P) on the surface of the substrate (A) on which the template (B) has been placed, and drying it, thereby forming a mesh-like structure (C) of the conductive particles (P) near the points of contact between the substrate (A) and the template (B), and then removing the template (B) from the substrate (A) to form a mesh-like structure (C) of the conductive particles (P) on the surface of the substrate (A).

The conductive film of the invention can also be produced by including a step of spreading a dispersion (D) of conductive particles (P) on the surface of a substrate (A), placing a template (B), having openings in a mesh structure running from the side that is to contact the substrate (A) through to the back side, over the dispersion (D) that has been developed on the surface of the substrate (A), and drying it, thereby forming a mesh-like structure (C) of the conductive particles (P) near the points of contact between the substrate (A) and the template (B), and then removing the template (B) from the substrate (A) to form a mesh-like structure (C) of the conductive particles (P) on the surface of the substrate (A).

<Substrate (A)>

The substrate (A) to be used for the invention preferably has a contact angle of 0.1-50° between its surface and the dispersion (D) of conductive particles (P), the contact angle being more preferably 0.1-30° and even more preferably 0.1-20°.

In order for the contact angle between the surface of the substrate (A) and the dispersion (D) of conductive particles (P) to be within this range, the substrate (A) is preferably subjected to surface pretreatment. The method of surface treatment may be, for example, UV irradiation, excimer irradiation, plasma irradiation, corona discharge, electron beam treatment or the like, or washing treatment with an organic solvent such as acetone or alcohol.

The form of the substrate (A) may be flat or film-like, for example. It is preferably flat from the viewpoint of easier management.

The material of the substrate (A) may be, for example, glass, a metal such as stainless steel or aluminum, or a resin such as polyester resin or acrylic resin.

When the substrate (A) on which the mesh-like structure (C) has been formed is to be used as a transparent conductive member, a transparent base such as glass or a transparent resin may be selected as the substrate (A).

When a transparent resin is used as the substrate (A), it is preferably one with a Young's modulus of 0.5 GPa or greater, a heat shrinkage factor of not greater than 1% at 130° C. and a melting point of 70° C. or higher, and preferably the film thickness is at least 15 μm.

Examples of transparent resins include polyester resins such as polyethylene terephthalate, polybutylene terephthalate and polyethylene naphthalate; acrylic resins such as polymethyl methacrylate; polycarbonates; polyethersulfones; polysulfones; polyolefins; polyimides; polyamides; polyamideimides; and polystyrene.

When a sintering step is necessary for the mesh-like structure (C), the material of the substrate (A) must be selected in consideration of the sintering temperature.

<Template (B)>

The template (B) to be used for the invention has openings in the mesh structure running from the substrate (A)-contacting side (s) through to the back side (r). The dispersing medium of the dispersion (D) of conductive particles (P), described hereunder, can be evaporated through these openings. At the sections without openings (the edge sections of the mesh of the template), the conductive particles (P) can be accumulated in a self-organizing phenomenon by surface tension.

In order to accumulate the conductive particles (P) in a self-organizing by surface tension at the edge sections of the mesh of the template, preferably all of the edges of the template facing the substrate (A) are edges that are not contacted to the substrate (A). Even if the substrate (A) and the template (B) are contacted, the template (B) will be pushed up by surface tension of the dispersion (D) during the drying step of steps 1 to 3 described below.

The template (B) may be, for example, a wire mesh made of stainless steel, aluminum or the like. In a wire mesh that is a plain weave or twill weave of thin wires made of stainless steel or aluminum, in particular, the intersections at the mesh edges become raised, and this is preferred since the edges of the mesh will not be contacted to the substrate (A) when it is placed on the substrate (A).

It is also preferred to subject the template (B) to surface pretreatment, by the same method as for preliminary surface treatment of the substrate (A) mentioned above.

When such a wire mesh is used, the line widths of the mesh-like structure (C) and the widths of the openings, formed by the production method of the invention, can be adjusted by the diameters of the wires of the wire mesh and the widths of the openings. The cross-sections of the wires used may be round, rectilinear, or another shape. The opening widths are the spacings between the wires forming the wire mesh. The pitch of the wire mesh is the spacing between the centers of the wires forming the wire mesh.

A template with a mesh structure, formed by electroforming, or a microsieve may also be used as the template (B). When a microsieve is used, fine particles (for example, nano- or micro-sized silica particles) are preferably adhered or fused to the surface, and the substrate (A) is mounted with the silica particle-adhered or -fused side facing the substrate (A).

According to the production method of the invention, it is possible to form on the substrate (A) a mesh-like structure (C) having a line width of about ⅒ to ⅓ of the diameter of the wire mesh wires used in the template (B).

The wire diameter is preferably 5-60 μm and more preferably 10-30 μm. If the wire diameter is 5-60 μm, the line width of the mesh-like structure (C) that is formed will also be narrow, and the transparency of the obtained conductive film will be high. When a microsieve is used as the template, the widths of the edges of the mesh are preferably approximately the same as the diameters of the wires.

If the template (B) has a regular mesh structure without defects, the pattern of the conductive film formed using the template will also have a regular mesh structure. A regular mesh structure is a mesh structure wherein all of the meshes have the same form.

For example, if a square mesh, a rectangular mesh or a regular hexagon mesh are connected with common edges, they have a regular mesh structure. Connection in a regular mesh structure will result in uniform conductivity. That is, the same conductivity will be exhibited at any location.

<Conductive Particles (P)>

Examples of conductive particles (P) to be used for the invention include metal fine particles, conductive polymer fine particles, and carbon particles.

Examples of metal fine particles include metals such as Au, Ag, Cu, Ni, Pt, Pd, Fe, Cr, Zn and Sn, their oxides, and alloys of such metals. Preferred among these are Au, Ag, Cu and Pt because of their high conductivity. From the viewpoint of cost, Ag, Cu and nickel-silver (an alloy of Cu, Zn and Ni) are preferred. The metal fine particles may be of a single type, or a combination of 2 or more types.

Examples of conductive polymers include polyaniline, polythiophene, polypyrrole, and their derivatives. The conductive polymer may be of a single type, or a combination of 2 or more types.

The weight-average particle size of the conductive particles (P) is preferably 1-1000 nm, more preferably 1-100 nm, even more preferably 1-30 nm and most preferably 1-20 nm. A smaller weight-average particle size of the conductive particles (P) will result in a higher shape-following property for the pattern shape of the template (B).

<Dispersion (D)>

The solid content of the dispersion (D) of conductive particles (P) is preferably 0.01-80 mass %, more preferably 0.01-10 mass %, even more preferably 0.01-5 mass % and most preferably 0.01-3 mass %. A lower solid content of the dispersion (D) will result in a more narrow line width of the mesh-like structure (C), and therefore a lighter tint and a more highly transparent conductive film.

The dispersing medium of the dispersion (D) may be, for example, water, or an organic solvent such as alcohol. Water is preferred because it has a suitable evaporation rate and lacks VOC (Volatile Organic Compounds). The dispersing medium may be of a single type, or a combination of 2 or more types.

A dispersion aid may also be used to stabilize the dispersion of the conductive particles (P).

<Formation of Mesh-Like Structure (C)>

The mesh-like structure (C) of the invention may be formed by either the following production method 1 or 2, changing the order of development of the dispersion (D) of conductive particles (P) on the surface of the substrate (A). Since this method employs a template with openings in a mesh structure (mesh-like template), it is possible to easily obtain a conductive film with a mesh-like pattern.

As used herein, "conductive film" refers to a film or sheet with conductivity, comprising a mesh-like structure (C) formed by conductive particles (P), or such a structure that has been conductively treated (hereunder referred to as "mesh-like structured product"), and a substrate or resin layer.

Also, as used herein, "conductive film" may refer to either a mesh-like structure (C) or mesh-like structured product, for convenience.

The production method of the invention may be used for convenient production even for conductive films with large areas on the meter-sized order.

Each production method will now be described.

<Production Method 1>

Step 1-1: The template (B) is placed on the surface of the substrate (A) so as to prevent its sliding during the subsequent steps 1-2 and 1-3. (FIG. 1)

Figure 2:
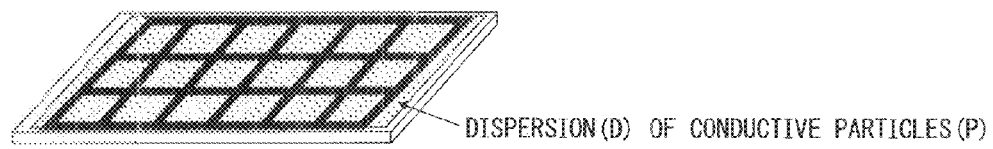
FIG. 2 is a schematic perspective view showing the substrate (A) and template (B) after development of the dispersion (D) of conductive particles (P).

Step 1-2: The dispersion (D) of conductive particles (P) is developed on the substrate (A) on which the template (B) has been placed, from the top side of the template (B). (FIG. 2)

Step 1-3: The dispersing medium of the dispersion (D) is dried, causing self-organizing formation of a mesh-like structure (C) in which the conductive particles (P) have concentrated near the points of contact between the substrate (A) and the template (B).

Figure 3:
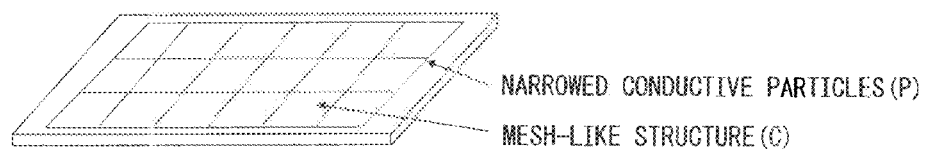
FIG. 3 is a schematic perspective view showing the substrate (A) and conductive particles (P) after removal of the template (B).

Step 1-4: The template (B) is removed to form a mesh-like structure (C) of the conductive particles (P) on the surface of the substrate (A), thus obtaining a mesh-like structured product. (FIG. 3)

<Production Method 2>

Figure 4:
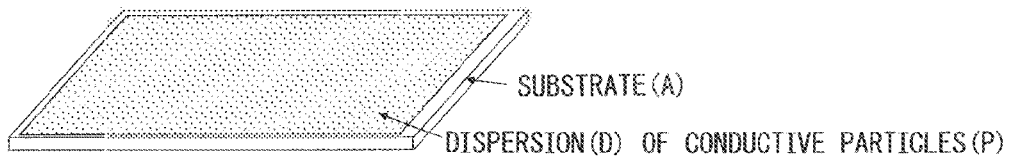
FIG. 4 is a schematic perspective view showing the substrate (A) after development of the dispersion (D) of conductive particles (P).

Step 2-1: A dispersion (D) of conductive particles (P) is developed on the surface of a substrate (A). (FIG. 4)

Figure 5:
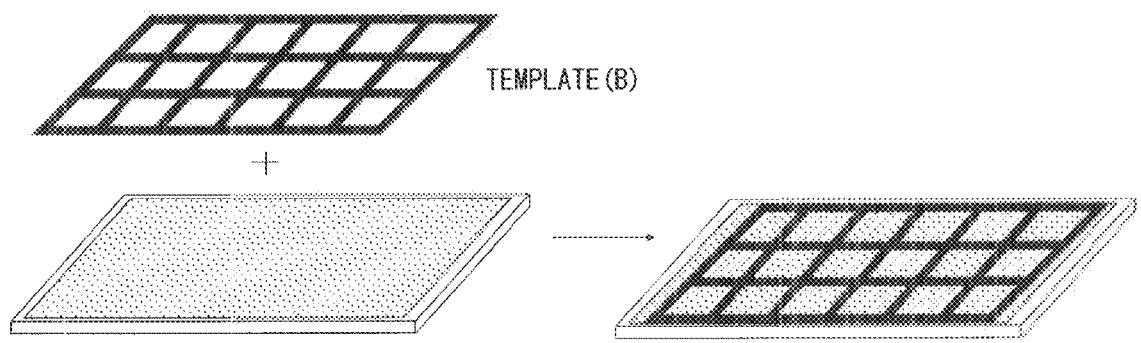
FIG. 5 is a schematic perspective view illustrating a step of placing the template (B) on the substrate (A) after development of the dispersion (D) of conductive particles (P).

Step 2-2: A template (B) is placed on the surface of the substrate (A) on which the dispersion (D) has been developed, so as to prevent its sliding during the subsequent step 2-3. (FIG. 5)

Step 2-3: The dispersing medium of the dispersion (D) is dried, causing self-organizing formation of a mesh-like structure (C) in which the conductive particles (P) have concentrated near the points of contact between the substrate (A) and the template (B).

Figure 6:
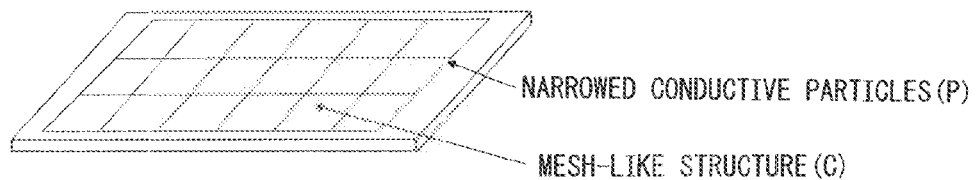
FIG. 6 is a schematic perspective view showing the substrate (A) and conductive particles (P) after removal of the template (B).
Figure 7:
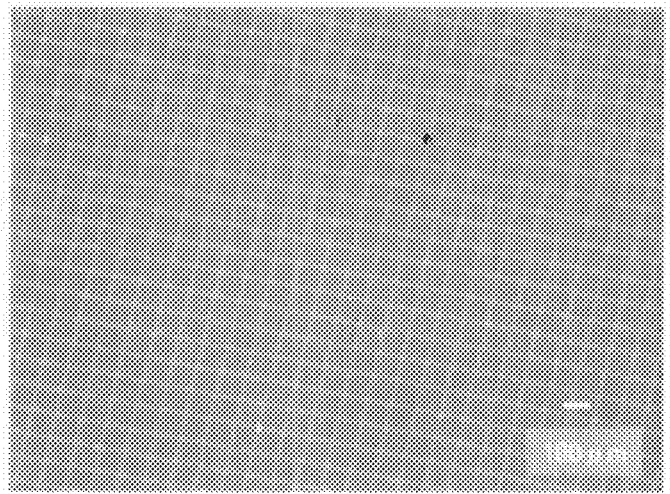
FIG. 7 is an optical microscope photograph of the conductive film obtained in Example 1 (before transfer).
Figure 8:
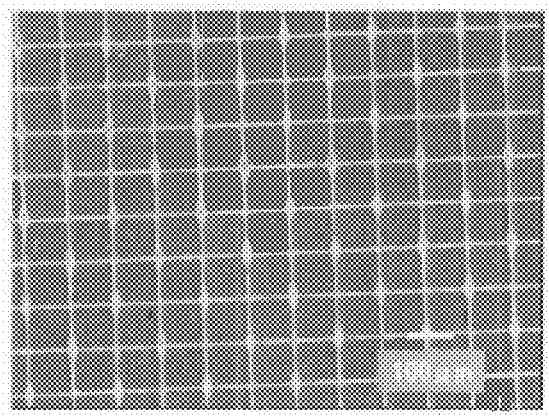
FIG. 8 is an optical microscope photograph of the conductive film obtained in Example 3 (before transfer).
Figure 9:
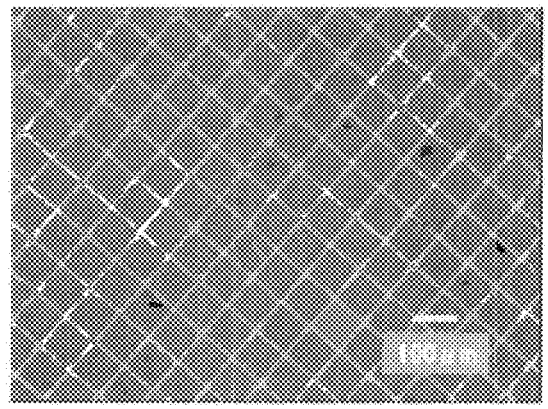
FIG. 9 is an optical microscope photograph of the conductive film obtained in Example 3 (after transfer).
Figure 10:
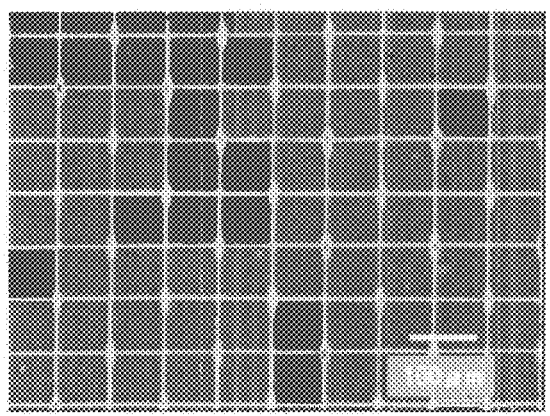
FIG. 10 is an optical microscope photograph of the conductive film obtained in Example 7 (before transfer).
Figure 11:
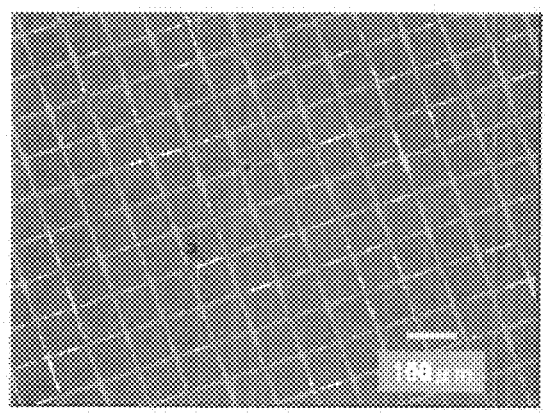
FIG. 11 is an optical microscope photograph of the conductive film obtained in Example 7 (after transfer).
Figure 12:
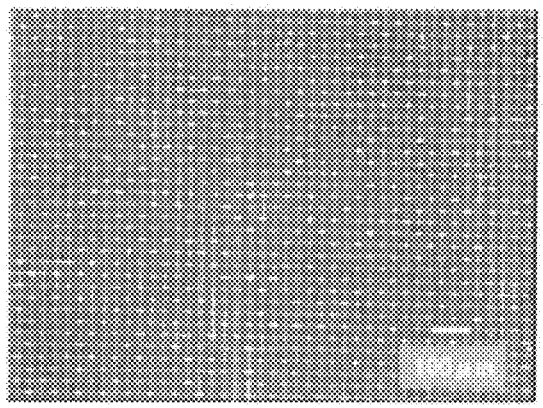
FIG. 12 is an optical microscope photograph of the conductive film obtained in Example 11 (before transfer).

Step 2-4: The template (B) is removed to form a mesh-like structure (C) of the conductive particles (P) on the surface of the substrate (A), thus obtaining a mesh-like structured product. (FIG. 6)

While a mesh-like structured product can be easily obtained by either production method 1 or 2, production method 1 is preferred for a more satisfactory yield.

In the production method of the invention, it is possible to form a pattern with the same shape as the template (B) on the surface of the substrate (A), and with a narrower line width than the line width of the template (B). For example, if a stainless steel wire mesh is used as the template (B), a mesh-like structured product composed of the conductive particles (P) with a line width of about $1/10$ to $1/3$ of the diameter of the stainless steel wires composing the wire mesh will be formed on the surface of the substrate (A).

The phenomenon by which the line width of the mesh-like structured product is significantly narrower than the line width of the template (B) is a phenomenon that has been discovered by the present inventors.

It is conjectured that this phenomenon occurs because the template (B) is pushed upward by surface tension of the dispersion (D) during drying of the dispersion (D) in step 1-3 or 2-3, thus promoting drying, while the conductive particles (P) become concentrated on the surface of the substrate (A), below the thin wires forming the template (B).

In the production method of the invention, it is possible to easily form a film wherein the cross-sectional shapes of the wires of the mesh-like structured product are each a segment (convex segment) that traces an ascending arc. If the cross-sectional shapes of the wires are arched segments, the surface resistance value will be low and transfer will be facilitated in the subsequent transfer step.

Each step of production method 1 will now be explained in detail.

<Step 1-1>

In this step, the template (B) is placed on the surface of the substrate (A). When production method 1 is to be carried out by a batch operation, a known type of adhesive or adhesive tape may be used to prevent slippage until step 1-4 in which the template (B) is removed from the substrate (A).

However, if bonding is formed on the surface of the substrate (A), a mesh-like structured product will not be formed on those sections, and therefore the bonded sections are preferably at the corners of the substrate.

The substrate (A) and the template (B) do not need to be firmly contacted. The spacing between the substrate (A) and the side (s) of the template (B) that contacts with the substrate (A) is preferably 0.01-20 μm and more preferably 0.01 μm-2 μm. If the spacing between the substrate (A) and side (s) is within this range, a mesh-like structured product will be obtained that almost completely reproduces the pattern shape of the template (B).

<Step 1-2>

This is a step of spreading the dispersion (D) of conductive particles (P), as the starting material for the mesh-like structured product, on the substrate (A) over which the template (B) has been placed. In this step it is sufficient for the dispersion (D) to be developed on one side of the sections where the mesh-like structured product is to be formed, and there is no restriction so long as the method allows uniform introduction into the openings of the template (B) without slippage of the template (B) from the substrate (A).

The method of introducing the dispersion (D) into the openings may be, for example, spin coating, doctor blading, dip coating, spraying or shear coating.

As mentioned above, surface pretreatment of the substrate (A) reduces the contact angle with the dispersion (D), and limiting the contact angle between the template (B) and the dispersion (D) to not greater than 50° and preferably not greater than 30° allows rapid development of the dispersion (D) on one side by surface tension, even when the dispersion (D) has been partially dropped onto the substrate (A) on which the template (B) has been placed.

<Step 1-3>

This is a step of drying the dispersing medium of the dispersion (D) (evaporating removal) after the dispersion (D) has been developed. The drying temperature is preferably 0° C. to 100° C., more preferably 3° C. to 60° C. and even more preferably 3° C. to 30° C.

The method of drying the dispersing medium may be, for example, allowing it to stand, drying with hot air, or drying under reduced pressure below atmospheric pressure. The drying conditions preferably include a drying time of 10 seconds or longer, preferably 30 seconds or longer and even more preferably 1 minute or longer.

During the process of drying the dispersing medium, the conductive particles (P) accumulate at the sections where the template (B) and substrate are contacted or in close approach, by a self-organizing phenomenon. As a result, a pattern with the same shape as the template (B) is successively formed.

If the other conditions are the same, a lower drying temperature results in a slower drying speed, and a higher shape-following property for the pattern of the template (B), allowing more dense wiring to be formed.

The mesh-like structured product is formed in a self-organizing phenomenon in this step because, during the process of drying the dispersing medium, the conductive particles (P) are concentrated while being attracted toward the gaps between the substrate (A) and the template (B) by the surface tension of the dispersing medium itself.

After drying of the dispersing medium, steps 1-2 to 1-3 may be repeated. This can further increase the conductivity of the conductive film.

<Step 1-4>

This is a step of removing the template (B) from the substrate (A). The method is not particularly restricted so long as the mesh-like structured product that has formed is not destroyed.

Each step of production method 2 will now be explained in detail.

<Step 2-1>

This is a step of spreading the dispersion (D) of conductive particles (P), as the starting material for the mesh-like structured product, on the surface of the substrate (A). In this step, it is sufficient for the dispersion (D) to be developed on one side of the sections on which the mesh-like structured product is to be formed.

The method of spreading the dispersion (D) may be, for example, spin coating, doctor blading, dip coating, spraying or shear coating.

<Step 2-2>

This is a step of placing the template (B) on the substrate (A), over the dispersion (D) that has been developed on the substrate (A) in step 2-1. There are no particular restrictions on the method of placing the template (B), so long as the dispersion (D) developed in step 2-1 is not dried and sections without the dispersion are not generated by surface tension. The method of placing the template (B) may be the method described in step 1-1.

<Step 2-3>

This is the same step as step 1-3.

After drying, the dispersion (D) of conductive particles (P) may be further developed again, and step 2-3 carried out. This can further increase the conductivity of the conductive film comprising the mesh-like structured product.

<Step 2-4>

This is the same step as step 1-4.

<Mesh-Like Structured Product>

The mesh-like structured product obtained according to the invention can have a line width of about 1/10 to 1/3 of the line width of the template (B). The line width of the mesh-like structured product is preferably 0.5-6 µm.

The transparency of the mesh-like structured product may be freely varied by changing the widths of the openings of the template (B). When a microsieve is used as the template (B), the high regularity of the microsieve results in excellent regularity of the pattern of the obtained mesh-like structured product as well.

If the line width of the mesh-like structured product is 0.5-6 µm, the widths of the openings of the mesh-like structured product will be adjustable so that the light transmittance is 80% or greater, when the conductive film is formed on a 1 mm-thick glass board (light transmittance: 90-93%), for example.

Since the mesh-like structured product of the invention allows line widths of a fine size not possible by the prior art, it is possible to reduce the opening widths.

With the large line widths of the prior art, it has been necessary to increase the opening widths in order to increase the transparency of the mesh-like structured product. Because the openings are insulated sections, increasing the transparency enlarges the insulated sections, resulting in inadequate performance as a transparent conductive film.

<Conductive Treatment>

The mesh-like structured product obtained according to the invention may be subjected to conductive treatment by known means after the mesh-like structure (C) of the conductive particles (P) has been formed. Examples of conductive treatment include methods using a kiln, heating with a laser or electron beam, or removal of the dispersing agent using a chemical solution. Methods of sintering by heating are convenient and preferred.

<Sintering Treatment>

Metal fine particles are generally in the form of a dispersion in water or an organic solvent, with a dispersing agent adsorbed on the surface to maintain the dispersion stability. When metal fine particles are used as the conductive particles (P), sintering after formation of the mesh-like structure (C) by the metal fine particles can fuse the metal fine particles together and form a highly conductive film.

The heating temperature for sintering is preferably 50° C. to 600° C. and more preferably 100° C. to 450° C. The sintering time will differ depending on the heating temperature and the physical properties of the dispersion (D), but it is preferably about 5-30 minutes.

The sintering may be carried out after the template (B) has been removed in step 1-4 or step 2-4, or before removing it.

<Electroplating>

The conductive film obtained according to the invention may be subjected to electroplating after the mesh-like structure (C) of the conductive particles (P) has been formed, using the formed conductive film as an electrode. This can improve the conductivity by increasing the density of the metal thin wires.

In this case, however, the plating formation speed is increased and the line width and film thickness of the conductive film are drastically increased, and therefore the metal ion concentration of the electroplating bath, the voltage and the current value must be adjusted.

<Surface Protection>

According to the invention, the conductive film may also be coated (immobilized) with a transparent resin or the like, without carrying out the transfer step described hereunder. When the substrate (A) is a transparent base of glass or the like, a transparent conductive substrate can thus be obtained.

In this case, however, a coating layer that is thicker than the conductive film will result in the conductive film being completely covered by the transparent resin, and this will eliminate the conductivity of the substrate surface. When it is desired to increase the adhesiveness of the conductive film on the substrate while maintaining the conductivity of the surface of the transparent conductive substrate, it will be necessary to adjust the thickness of the coating layer.

<Other>

The conductive film obtained according to the invention may be coated with a transparent conductive film such as zinc oxide or tin oxide. This can impart conductivity to the openings, which normally consists of an insulating layer. Examples of transparent conductive films include zinc oxide, tin oxide, fluorine-doped tin oxide, tin-doped indium oxide, aluminum-doped zinc oxide and gallium-doped zinc oxide.

The method of forming the transparent conductive film may be any method known in the prior art. Examples include vacuum vapor deposition, sputtering, ion plating, thermal decomposition, spray CVD, colloid methods and sol-gel methods.

<Transfer Step>

In the production method of the invention, if a resin layer is further formed on the surface of the substrate (A) after the mesh-like structured product has been formed on the surface of the substrate (A), and the obtained resin layer is released from the substrate (A), the mesh-like structured product can thus be transferred onto the surface of the resin layer (transfer method 1).

For example, a resin layer may be formed by coating a monomer composition (X) on the surface of the substrate (A) after the mesh-like structured product has been formed on the surface of the substrate (A) and polymerizing it, and the obtained resin layer may be released from the substrate (A) to transfer the mesh-like structured product onto the surface of the resin layer. As a separate method, a resin layer may be formed by coating a resin composition (Y) onto the surface of the substrate (A) instead of a monomer composition (X).

Alternatively, in the production method of the invention, a monomer composition (X) or resin composition (Y) may be further coated on the surface of the substrate (A) after the mesh-like structured product has been formed on the surface of the substrate (A), and a substrate (E) may be placed thereover, a resin layer subsequently formed and the substrate (E) then released from the substrate (A), to transfer the mesh-like structured product onto the surface of the substrate (E) (transfer method 2). For example, if a substrate (E) is placed on a monomer composition (X) that has been coated on the surface of the substrate (A) and then a resin layer is formed by polymerizing the monomer composition (X), after which the substrate (E) is released from the substrate (A), it will be possible to transfer the mesh-like structured product onto the surface of the substrate (E), using the polymer of the monomer composition (X) as a binder. As a separate method, a monomer composition (X) that has been coated onto the surface of the substrate (A) may be half-cured, and then a substrate (E) placed on the half-cured monomer composition (X) and the half-cured monomer composition (X) subsequently polymerized to form a resin layer, after which the substrate (E) may be released from the substrate (A), to transfer the mesh-like structured product onto the surface of the substrate (E), using the polymer of the monomer composition (X) as a binder.

Before the monomer composition (X) or resin composition (Y) is coated, it is preferred to pretreat the surface of the substrate (A) on which the mesh-like structured product has been formed, by UV irradiation, excimer irradiation, plasma irradiation, corona discharge treatment or electron beam treatment. Such a procedure will facilitate transfer of the mesh-like structured product.

<Monomer Composition (X)>

The monomer composition (X) to be used for the invention is a photocuring monomer composition (X1) or thermosetting monomer composition (X2), and a single type may be used alone or 2 or more may be used in combination.

When a transparent substrate is to be used as the substrate (E), the difference in refractive index between the obtained polymer (resin layer) and the substrate (E) is preferably not greater than 0.1. A smaller difference in refractive index between the polymer (resin layer) and the substrate (E) will result in higher transparency. The refractive index can be measured according to JIS K-7105, using a KPR-2 by Carnyu Optical Industries.

<Photocuring Monomer Composition (X1)>

When a photocuring monomer composition (X1) is used, the photocuring monomer composition (X1) coated on the surface of the substrate (A) may be irradiated with an active energy beam such as ultraviolet rays for polymerization, to transfer the conductive film.

The photocuring monomer composition (X1) comprises a vinyl monomer (x1) and a photopolymerization initiator (x2).

The blending ratio is preferably 0.1-10 parts by weight of the photopolymerization initiator (x2) with respect to 100 parts by weight of the vinyl monomer (x1), for optimal curing speed. If the photopolymerization initiator (x2) is at least 0.1 part by weight, the curability of the photocuring monomer composition (X1) will be improved. If the photopolymerization initiator (x2) is not greater than 10 parts by weight, coloration of the obtained polymer will be inhibited.

<Vinyl Monomer (x1)>

The vinyl monomer (x1) may be, for example, a vinyl monomer with at least two vinyl groups (x1-1), or a vinyl monomer with one vinyl group (x1-2).

Examples of vinyl monomers with at least two vinyl groups (x1-1) include diethyleneglycol di(meth)acrylate, triethyleneglycol di(meth)acrylate, tetraethyleneglycol di(meth)acrylate, polybutyleneglycol di(meth)acrylate, 1,4-butanediol di(meth)acrylate, 1,6-hexanediol di(meth)acrylate, 1,9-nonanediol di(meth)acrylate, trimethylolpropane tri(meth)acrylate, pentaerythritol tetra(meth)acrylate, glycerin tri(meth)acrylate and dipentaerythritol hexa(meth)acrylate. There may also be mentioned known ester poly(meth)acrylates, known urethane poly(meth)acrylates, known epoxy poly(meth)acrylates and known ethylene oxide-modified bisphenol A di(meth)acrylates.

These may be used alone or in combinations of two or more.

Examples of vinyl monomers with one vinyl group (x1-2) include methyl (meth)acrylate, ethyl (meth)acrylate, butyl (meth)acrylate, hexyl (meth)acrylate, cyclohexyl (meth)acrylate, dicyclopentenyl (meth)acrylate, phenyl (meth)acrylate, benzyl (meth)acrylate, phenoxyethyl (meth)acrylate, isobornyl (meth)acrylate, 2-hydroxyethyl (meth)acrylate, phosphoethyl (meth)acrylate and styrene.

These may be used alone or in combinations of 2 or more.

When vinyl monomer (x1-1) and vinyl monomer (x1-2) are used in combination as the vinyl monomer (x1), the vinyl monomer (x1-2) is used at preferably 0.1-20 parts by weight, more preferably 0.5-15 parts by weight and even more preferably 1-10 parts by weight with respect to 100 parts by weight of vinyl monomer (x1-1). If the vinyl monomer (x1-2) is used at 0.1 part by weight or greater, it will be possible to lower the viscosity of the photocuring monomer composition (X1). If the vinyl monomer (x1-2) is used at not greater than 20 parts by weight, the heat resistance of the obtained polymer will not be lowered.

<Photopolymerization Initiator (x2)>

Examples for the photopolymerization initiator (x2) include carbonyl compounds such as benzoin monomethyl ether, benzophenone, 1-hydroxycyclohexylphenyl ketone (IRGACURE184™, Ciba, Japan), 2-hydroxy-1-{4-[4-(2-hydroxy-2-methylpropionyl)-benzyl]-phenyl}-2-methylpropan-1-one (IRGACURE127™ Ciba, Japan); sulfur compounds such as tetramethylthiuram monosulfide and tetramethylthiuram disulfide; acylphosphine oxides such as 2,4,6-trimethylbenzoyldiphenylphosphine oxide and bis(2,4,6-trimethylbenzoyl)phenylphosphine oxide; and bis(η5-2,4-cyclopentadien-1-yl)-bis(2,6-difluoro-3-(1H-pyrrol-1-yl)-phenyl)titanium (IRGACURE784™, Ciba, Japan). Preferred among these are 1-hydroxycyclohexylphenyl ketone, 2-hydroxy-1-{4-[4-(2-hydroxy-2-methylpropionyl)-benzyl]-phenyl}-2-methylpropan-1-one and 2,4,6-trimethylbenzoyldiphenylphosphine oxide, for their excellent curability.

These may be used alone or in combinations of 2 or more.

<Photocuring Method>

The light source for the active energy beam to be used for photocuring may be, for example, a chemical lamp, low pressure mercury lamp, high pressure mercury lamp, metal halide lamp, electrodeless UV lamp (product of Fusion UV Systems, KK.), visible light halogen lamp, xenon lamp or sunlight.

The atmosphere during active energy beam irradiation may be air, or an inert gas such as nitrogen or argon.

The irradiation energy for an active energy beam is preferably such that the cumulative energy in a wavelength range of 200-600 nm and preferably 320-390 nm is 0.01-10 J/cm$^2$ and preferably 0.5-8 J/cm$^2$.

The active energy beam is preferably irradiated from the front side, where the substrate (A) side is defined as the back side.

<Thermosetting Monomer Composition (X2)>

When a thermosetting monomer composition (X2) is used, the thermosetting monomer composition (X2) coated on the surface of the substrate (A) may be heated for polymerization, to transfer the mesh-like structured product.

The thermosetting monomer composition (X2) comprises a vinyl monomer (x1) and a thermopolymerization initiator (x3).

The blending ratio is preferably 0.1-10 parts by weight of the thermopolymerization initiator (x3) with respect to 100 parts by weight of the vinyl monomer (x1), for optimal curing speed. If the thermopolymerization initiator (x3) is at least 0.1 part by weight, the curability of the thermosetting monomer composition (X2) will be improved. If the thermopolymerization initiator (x3) is not greater than 10 parts by weight, coloration of the obtained polymer will be inhibited.

The vinyl monomer (x1) to be used in the thermosetting monomer composition (X2) is the same as the vinyl monomer (x1) to be used in the photocuring monomer composition (X1).

<Thermopolymerization Initiator (x3)>

Examples for the thermopolymerization initiator (x3) include azo compounds such as 2,2'-azobisisobutyronitrile and 4,4'-azobis-(4-cyanovaleric acid); persulfuric acid compounds such as ammonium persulfate salts; and organic peroxides such as diisopropylbenzene hydroperoxide, p-menthane hydroperoxide, cumene hydroperoxide and t-butyl hydroperoxide.

<Thermosetting Method>

The thermosetting monomer composition (X2) is preferably heated at a temperature of 60° C. to 130° C. for about 0.1-2 hours.

<Resin Composition (Y)>

The resin composition (Y) to be used for the invention is preferably composed mainly of a transparent resin. Examples of transparent resins include acrylic-based resins, polystyrene-based resins, acrylonitrile-based resins, polyamide-based resins, polyester-based resins, phenol-based resins, melamine-based resins and epoxy resins.

The resin composition (Y) is also preferably diluted with a solvent or the like for preparation as a varnish. Examples of solvents include benzene, toluene, xylene, methyl ethyl ketone, methyl isobutyl ketone, acetone, methanol, ethanol, isopropyl alcohol, 2-butanol, ethyl acetate, butyl acetate, propyleneglycol monomethyl ether, propyleneglycol monomethyl ether acetate, diacetone alcohol and N,N'-dimethylacetamide. The resin composition (Y) may also contain additives, such as an ultraviolet absorber.

If the resin composition (Y) is coated in molten form, it will be possible to form a resin layer. For example, when the resin composition (Y) is used as a dilution with a solvent, it may be heated (dried) after coating to form the resin layer.

<Substrate (E)>

The substrate (E) to be used in transfer method 2 is preferably a transparent material, in order to obtain a transparent conductive member.

As transparent materials there are preferred flexible transparent resin films and transparent resin sheets, and specifically polyester films such as polyethylene terephthalate (PET); polyolefin films such as polyethylene or polypropylene; polycarbonate films; acrylic films; and norbornane films.

<Continuous Process Flow>

Figure 16:
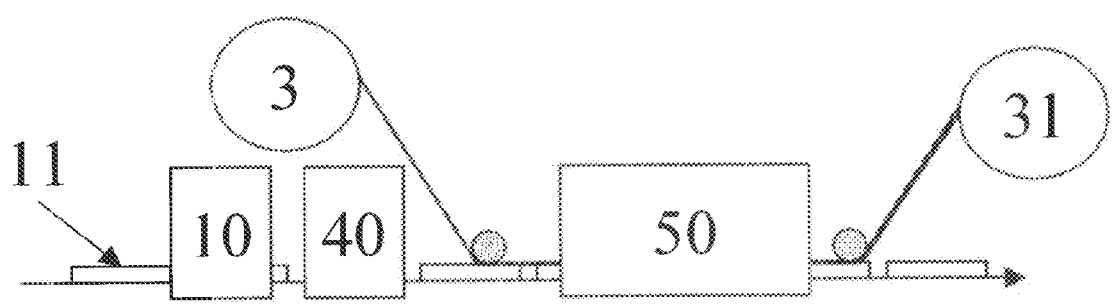
FIG. 16 is a schematic diagram illustrating an example of a production process for a conductive film according to the invention.
Figure 17:
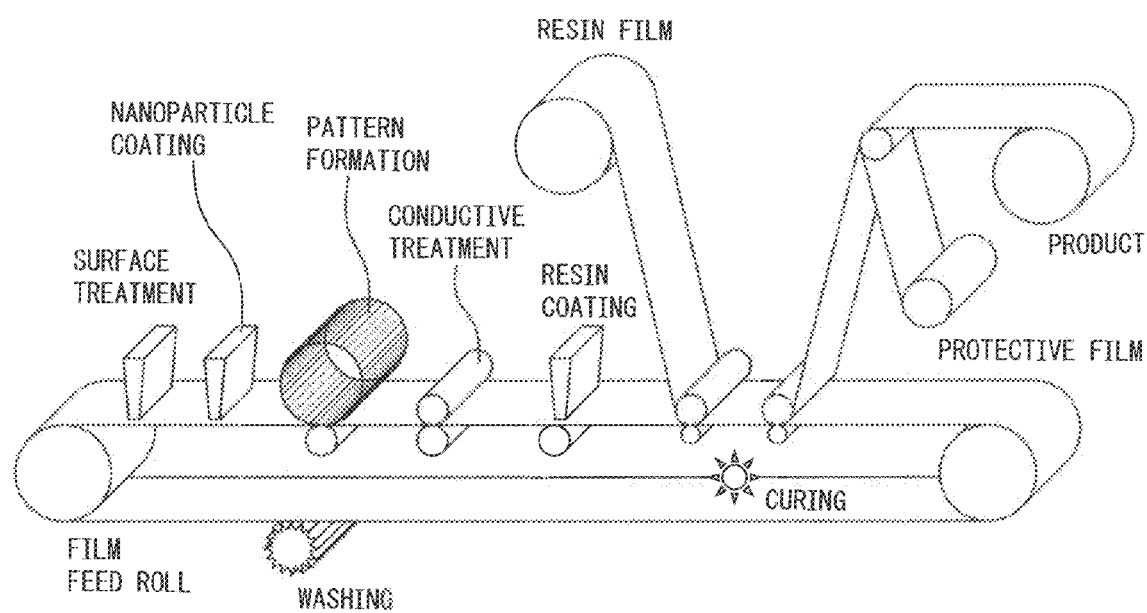
FIG. 17 is a schematic diagram illustrating an example of a production process for a conductive film according to the invention.
Figure 18:
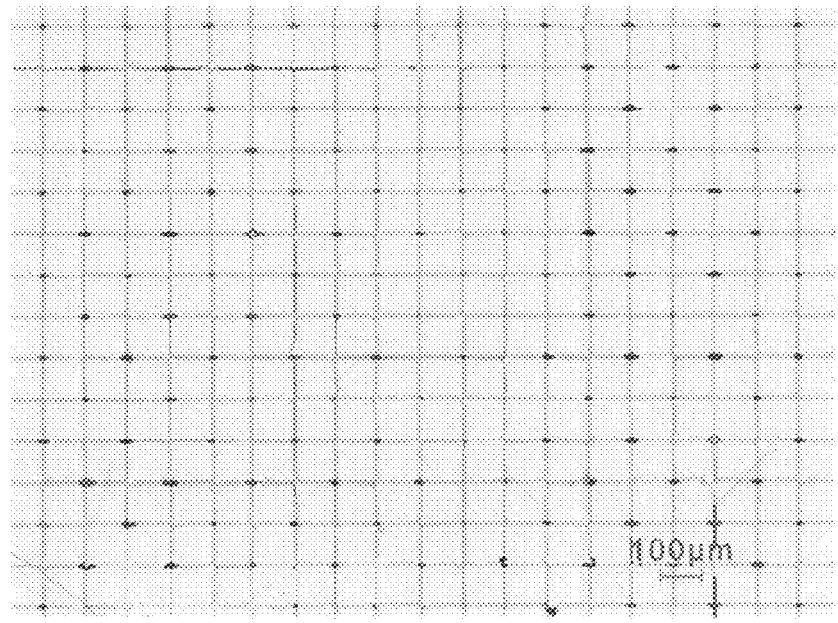
FIG. 18 is an optical microscope photograph of the conductive film obtained in Example 14 (before transfer).
Figure 19:
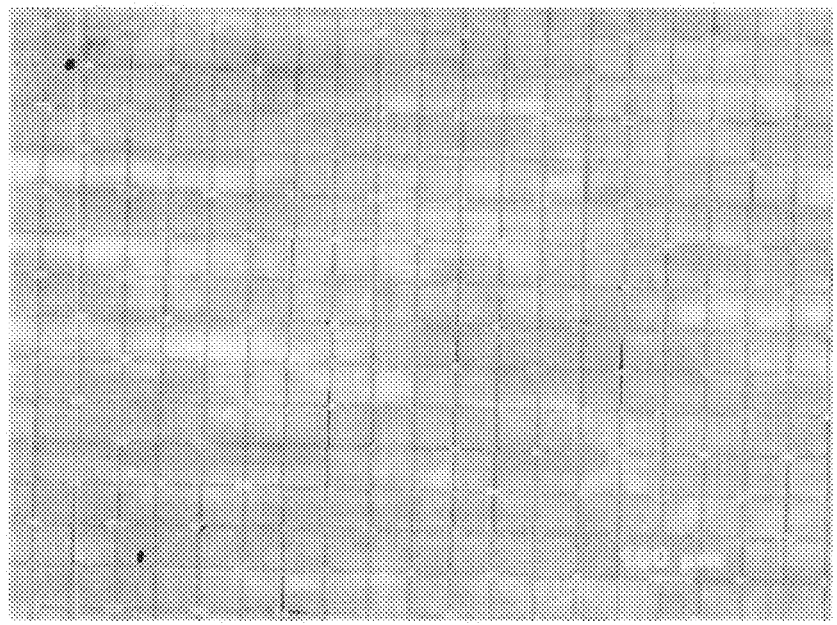
FIG. 19 is an optical microscope photograph of the conductive film obtained in Example 15 (before transfer).
Figure 20:
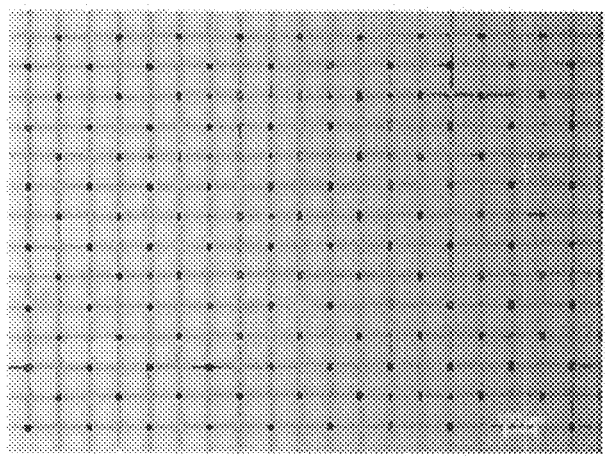
FIG. 20 is an optical microscope photograph of the conductive film obtained in Example 16 (before transfer).
Figure 21:
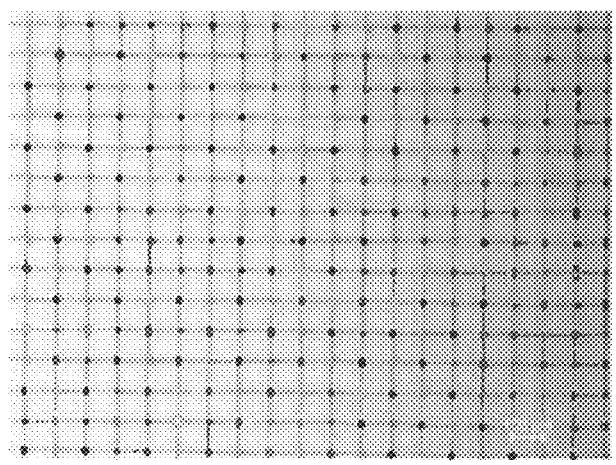
FIG. 21 is an optical microscope photograph of the conductive film obtained in Example 17 (before transfer).

The production method of the invention is preferably a continuous process, from the viewpoint of productivity. A continuous process will now be described using schematic diagrams (FIGS. 15 to 17).

<Continuous Conductive Film-Forming Step>

Figure 15:
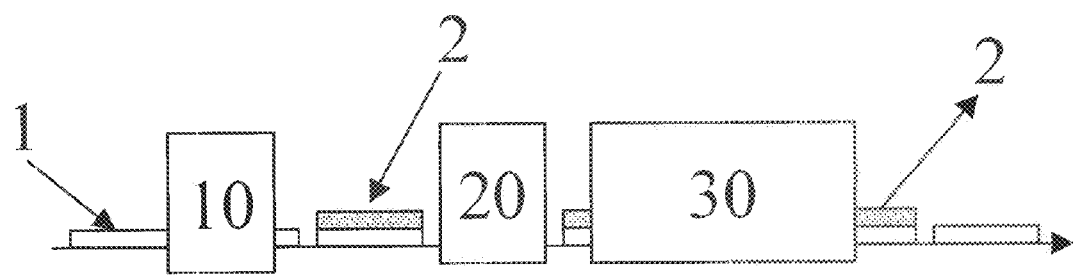
FIG. 15 is a schematic diagram illustrating an example of a production process for a conductive film according to the invention.

FIG. 15 shows a schematic diagram of a process wherein formation of a "conductive film" of the invention is assumed to be carried out in a continuous manner.

The substrate (A) 1 is fed to a surface treatment step 10 for adjustment of the contact angle with the dispersion (D) of conductive particles (P), and after placing the template (B) 2 on the top side of the substrate (A) 1, it is fed to the step 20 for development of the dispersion (D), and a drying step 30, in that order.

At this time, the template (B) 2 may be formed into a cylindrical or endless belt shape, for more efficient continuous formation of the conductive film.

In the surface treatment step 10, the contact angle of the substrate (A) 1 with respect to the dispersion (D) is reduced, so that the dispersion (D) is rapidly developed in an even manner on the top side of the substrate (A) 1 by surface tension.

By repeating step 20 to step 30 two or more times, it is possible to further increase the conductivity.

A sintering step may be carried out if necessary after the drying step.

<Continuous Transfer Step>

FIG. 16 shows a schematic diagram of an example of a process wherein "transfer" according to the invention is assumed to be carried out in a continuous manner. This example is a representative mode in which a substrate (E) 3 is placed on a monomer composition (X) that has been coated on the surface of a substrate (A) 1, and then the monomer composition (X) is polymerized to form a resin layer.

The substrate (A) 11 on which the conductive film has been formed may, if necessary, be fed to step 40 in which the monomer composition (X) is coated and step 50 in which the monomer composition (X) is polymerized, in that order, after surface treatment in the surface treatment step 10.

After step 40, and before step 50, the substrate (E) 3 may be pressed against the substrate (A) 11 on which the monomer composition (X) has been coated, and the monomer composition (X) polymerized, and then the substrate (E) 3 released from the substrate (A) 1, to obtain a conductive member (product) 31 on which the conductive film has been transferred to the substrate (E) 3 (transfer method 2).

A pressing roll may be used to press the substrate (E) 3 against the substrate (A) 11. The pressing roll functions to push out air that has been taken into in the monomer composition (X), while spreading the monomer composition (X) on the surface of the substrate (A) 11.

<Continuous Conductive Film-Forming to Transfer Step>

The process from "conductive film" formation to "transfer" can be carried out as a series of steps. An example of such a process is conceptually illustrated in FIG. 17.

<Conductive Member>

The substrate (A) with the conductive film formed thereon and the polymer (resin layer) with the conductive film transferred (transfer method 1), and the substrate (E) having the conductive film transferred (transfer method 2), as obtained according to the invention, both exhibit excellent conductivity and are therefore useful as conductive members.

Also, the substrate (A) with the conductive film formed thereon and the polymer (resin layer) with the conductive film transferred (transfer method 1), and the substrate (E) having the conductive film transferred (transfer method 2), as obtained according to the invention, both have excellent transparency and are therefore particularly useful as transparent conductive members.

Preferred embodiments of conductive films obtained by the method of the invention are conductive films having fine patterns formed by conductors on substrate surfaces, and specifically, are conductive films having the following features (a) to (c).
(a) The fine pattern has a mesh structure.
(b) The line width of the fine pattern is 0.5-6 μm.
(c) The shape of the cross-section of the thin wires of the fine pattern has a segment structure that traces an ascending arc.

According to the invention, a mesh (-like) structure (a) is a structure wherein multiple nodes are connected by multiple wires. The mesh structure of (a) may have a regular mesh-like structure or an irregular mesh-like structure, but a regular mesh-like structure is especially preferred.

A regular mesh-like structure, according to the invention, is a mesh structure wherein all of the meshes have the same form. For example, if a square mesh, a rectangular mesh or a regular hexagon mesh are connected with common edges, they have a regular mesh structure.

According to the invention, the regular mesh-like structure preferably has a regular structure that is continuous across a large area, for a conductive film composed of a transparent insulating film and opaque conductor sections, since this will have a major effect on the quality of the conductive film.

In the case of a conductive film composed of a transparent insulating film and opaque conductor sections, even a regular mesh-like structure on the order of not greater than several μm will have continuity of the conductive sections and insulated sections, and therefore although this may be considered to be non-uniform conductivity in the strict sense when the conductive sections and insulated sections are compared, this is seldom problematic for use as an actual conductive film.

Regarding the line width of (b), if the line widths of the conductors, as the opaque sections, are too small to be confirmed by the naked eye, the conductive film will appear transparent, and therefore this value must be sufficiently smaller than 30 μm which is the lower limit of resolution for human visual perception, but the line width is preferably even smaller than this in order to further increase the transparency. According to the invention it is possible to achieve thin wires of 6 μm and smaller which have been difficult with existing technology. Regarding the cross-sectional shape of (c), since the cross-section is arc-shaped, the thicknesses of the wires are larger than conductive thin wires produced by prior art technology, and therefore the surface resistivity can be reduced.

The conductive film of the invention also preferably has (d) a light transmittance of 80% or greater, with a higher transmittance being preferred for a transparent conductive film. The transmittance is largely affected by the transparent film serving as the base, but is also affected by the opening diameters of the conductor sections. A conductive film satisfying the features (a) to (d) above exhibits both high conductivity and high transparency, and is particularly preferred from the viewpoint of a constant value for surface resistivity at any section of the conductive film surface.

The surface resistivity of the conductive film of the invention is preferably not greater than 100 Ω/sq. and even more preferably not greater than 10 Ω/sq. The surface resistivity of a conductive film is one of the basic performance values as a product and will determine its application, and a value of not greater than 100 Ω/sq. will allow development for various purposes including electromagnetic wave shield, solar cell and display uses. This is because the conductor on the conductive film hardens due to surface tension on the substrate, and the cross-section is arc-shaped, such that the thicknesses of the wires are larger than conductive thin wires produced by prior art technology, and the surface resistivity can thus be reduced.

<Uses>

A conductive member obtained according to the invention may be suitably used for purposes such as transparent electrodes for image display devices including plasma displays, liquid crystal displays, electric field discharge displays, electroluminescence displays and electronic paper; transparent electrodes for touch panels; transparent electrodes for solar cells; and electromagnetic wave shielding films.

EXAMPLES

The invention will now be described in greater detail by examples, with the understanding that the invention is not limited to these examples.

<Measurement of Line Width and Opening Width (Pitch)>

An optical microscope (BX51123 MDS™ microscope system by Olympus Corp.) was used to observe the conductive film, and the line widths and opening widths were measured from the image at 5 locations, recording the average values as the line width and opening width.

<Measurement of Transparency (Light Transmittance)>

A haze meter (NDH200™ by Nippon Denshoku Industries Co., Ltd.) was used to measure the light transmittance of the sample at 5 locations, and the average value was recorded as the transparency (light transmittance).

<Measurement of Conductivity (Surface Resistance Value)>

A serial four-point probe was mounted on a resistivity meter (LORESTA GP™ by Mitsubishi Chemical Corp.), and the surface resistance value of the sample was measured at 5 locations, recording the average value as the conductivity (surface resistance value).

<Preparation of Monomer Composition (X)>

Each sample was mixed in the proportion shown below to prepare monomer composition (X).

Monomer Composition (X):
NEW FRONTIER BPEM-10 40 mass %
(Ethylene oxide-modified bisphenol A dimethacrylate)
NEW FRONTIER GX-8662V 35 mass %
(Urethane polyacrylate)
ACRIESTER PBOM 20 mass %
(Polybutyleneglycol dimethacrylate)
NEW FRONTIER PHE 5 mass %
(Phenoxyethyl acrylate)
IRGACURE184 1.6 mass %

Of the aforementioned starting materials, NEW FRONTIER BPEM-10, NEW FRONTIER GX-8662 V and NEW FRONTIER PHE are products of Dai-ichi Kogyo Seiyaku Co., Ltd., ACRIESTER PBOM is a product of Mitsubishi Rayon Co., Ltd., and IRGACURE184 is a product of Ciba, Japan.

Examples 1 to 11

The substrate (A) used was a glass board (dimensions: 50 mm×50 mm×1.0 mm, light transmittance: 91%, surface resistance value: ≥$10^{10}$ Ω/sq., product of Matsunami Glass Industries, Ltd.).

The template (B) used was a stainless steel wire mesh (plain weave wire mesh), shown in Table 1.

The dispersion (D) used was an aqueous dispersion of gold fine particles, appropriately diluted with deionized water to the solid content listed in Table 1.

FINESPHERE GOLD W011 (product of Nippon Paint Co., Ltd., conductive fine particles: gold, weight-average particle size: 10 nm, solid content: 10 mass %, trade name)

FINESPHERE GOLD W101 (product of Nippon Paint Co., Ltd., conductive fine particles: gold, weight-average particle size: 20 nm, solid content: 10 mass %, trade name)

A stainless steel wire mesh was placed on the surface of a glass board, and the aqueous dispersion of gold fine particles in the coating amount listed in Table 1 was developed and allowed to stand at 5° C. for 60 minutes for drying of the aqueous dispersion.

After removing the stainless steel wire mesh from the glass board surface, the gold fine particles were fired in a dryer heated to the sintering temperature shown in Table 1, forming a mesh-like structure of gold on the glass board (a square-shaped regular mesh), to obtain a conductive film.

Next, using a benchtop optical surface treatment apparatus (PL16-110™ low pressure mercury lamp by Sen Lights Co., Ltd.), and placing the conductive film-formed glass board at a position 15 mm distant from the light source, the surface (conductive film side) of the glass board was subjected to UV irradiation for approximately 1 minute.

Next, a glass pipette was used to coat the monomer composition (X) from above the conductive film of the glass board, and a PET film (A4300™ by Toyobo, Ltd., thickness: 188 light transmittance: 88%, surface resistance value: ≥$10^{15}$ Ω/sq., no antireflection film) was placed thereover as a substrate (E) while pressing to avoid inclusion of air bubbles.

A 6 kW (120 W/cm) high pressure mercury lamp was then used for irradiation of ultraviolet rays at 800 mJ/cm$^2$ from the PET film side, for polymerization of the monomer composition (X). The PET film was slowly released from the glass board to obtain a conductive film-transferred PET film.

The thickness of the conductive film-transferred PET film was measured using a micrometer (MDC-25MJ™ by Mitsutoyo Corp.), producing results of 220-230 μm in each case. This indicated that the thickness of the monomer composition (X) polymer (resin layer) was 30-40 μm.

Example 12

A conductive film was obtained in the same manner as Example 5, except that after drying the aqueous dispersion of gold fine particles at 5° C. for 60 minutes, the same procedure was repeated (development-drying, twice).

Production Example 1

Fabrication of Template (B5))

After coating the bottom side of a 250 mesh microsieve (product of Tokyo Process Service Co., Ltd., line width: 20 μm, pitch: 102 μm, open area ratio: 75%) with a suspension of dispersed silica particles with a particle size of 100 nm, it was dried. It was then heated to 450° C. to fuse the silica particles to the bottom side of the microsieve, thereby hydrophilicizing the bottom side, and forming a thin wire form with irregularities on the surface.

Example 13

The template (B5) fabricated in Production Example 1 was situated on the surface of a glass board with the silica particle-fused side facing downward, and 110 μL of an aqueous dispersion of gold fine particles (weight-average particle size: 20 nm, solid content: 1 wt %) was developed and allowed to stand at 5° C. for 60 minutes for drying of the aqueous dispersion. During the drying process, the gold fine particles were attracted to the thin wire, forming a regular mesh-like structure.

Figure 13:
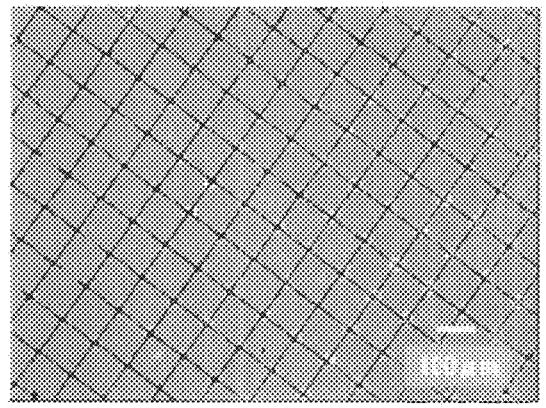
FIG. 13 is an optical microscope photograph of the conductive film obtained in Example 13 (before transfer).

After removing the template (B5) from the surface of the glass board, the glass board was fired for 17.5 minutes in a dryer heated to 450° C., forming a gold mesh-like structure on the glass board, to obtain a conductive film. (FIG. 13)

The gold mesh-like structure forming the conductive film had a regular square shape, with a line width of 4.5 μm and a mesh pitch of 102 μm. The surface resistance value of the conductive film was 15 Ω/sq.

Example 14

A film was formed in the same manner as Example 3, except that a stainless steel sheet was used as the substrate (A).

Example 15

A film was formed in the same manner as Example 3, except that a PET film (A4300™, product of Toyobo, Ltd.) was used as the substrate (A).

Examples 16 and 17

A film was formed in the same manner as Example 3, using the following fine particle aqueous solution as dispersion (D), diluted with deionized water to a solid content of 2 mass % (Example 16) or 5 mass % (Example 17). The sintering temperature was 275° C.

SVW001 (product of Nippon Paint Co., Ltd., silver fine particle aqueous solution, mean diameter: 10 nm, solid content: 10 mass %)

The evaluation results for Examples 1 to 17 are shown in Table 1.

Photomicrographs of the conductive film on the glass board (before transfer) for some of the examples, and photomicrographs of the conductive film on the PET film (after transfer) for some of the examples are shown in FIGS. 7 to 13 and FIGS. 18 to 21.

The gold mesh-like structure forming the conductive film before and after transfer had essentially the same structure as the template used, and the line width of the mesh-like structure was found to be narrower than the line width of the template (the diameter of the wires, in the case of a wire mesh).

Figure 14:
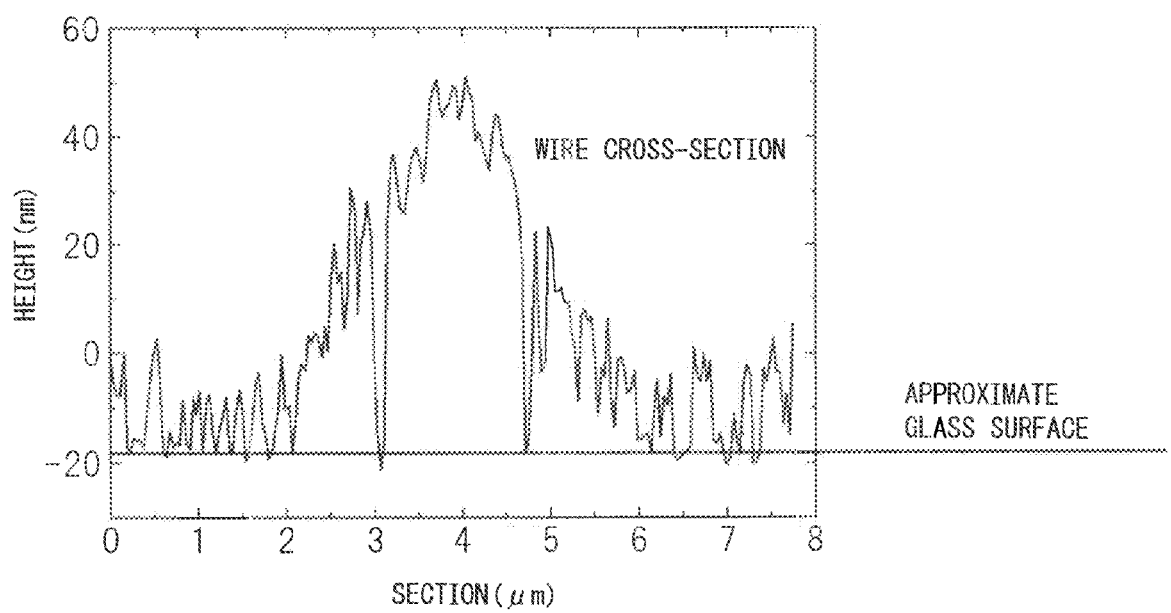
FIG. 14 is a graph showing data from an AFM (atomic force microscope) for the cross-sectional shape of the conductive film obtained in Example 3 (before transfer).

Also, observation of the cross-sectional shape of the thin wires of the conductive film on the glass board obtained in Example 3 (before transfer) with an AFM (atomic force microscope) in contact mode confirmed that they were segments tracing out ascending arcs on the glass board. (FIG. 14)

Comparative Example 1

A 2 μm-thick copper foil was roll-laminated onto a 4 cm² PET film with a thickness of 100 μm (EMBRET S™, product of Unitika, Ltd.) under conditions of 150° C., 20 kgf/cm², to form a film with a copper foil on the surface.

The film was subjected to a photolithography step to form a mesh-like geometrical pattern with a line width of 18 μm and a pitch of 250 μm. In the photolithography step, a resist (DFR) attachment step, exposure step, developing step, chemical etching step and resist release step were carried out.

The evaluation results are shown in Table 1.

Comparative Example 2

Nylon fiber (diameter: 30 μm) having Ni covering the surfaces was contact bonded to a 4 cm² PET film with a thickness of 125 μm into a mesh form under conditions of 200° C., 20 kgf/cm², to produce a PET film having on the surface a Ni mesh with a pitch of 220 μm, a line width of 25 μm and a film thickness of 25 μm.

The evaluation results are shown in Table 1.

Comparative Example 3

After dispersing 4 g of polystyrene fine particles with a particle size of 2.2 μm in 10 g of water, the dispersion was coated onto a glass board by a shear coating method to form a single-layer film. It was then heated on a hot plate at 150° C. for 30 seconds, to produce a single-layer planar hexagonal structure by thermal deformation of the polystyrene fine particles.

After dispersing 0.1 g of gold fine particles with a particle size of 20 nm in 0.9 g of water, the dispersion was coated 10 times onto a glass board on which the aforementioned polystyrene single-layer film had been formed, by a shear coating method, and allowed to permeate the gold particles.

The gold particles were fused by heating to 450° C. with a heater, and the polystyrene single-layer film was removed by heating to produce a conductive film having a gold planar hexagonal structure.

The evaluation results are shown in Table 1.

TABLE 1

| | Template (B) Stainless steel wire mesh | | Dispersion (D) Gold fine particle aqueous dispersion | | | | | Conductive film | | | | | | | |
|---|---|---|---|---|---|---|---|---|---|---|---|---|---|---|---|
| | | | | | | Sintering conditions | | Line width | | Opening width | | Light transmittance | | Surface resistance value | |
| | Wire diameter [μm] | Pitch [μm] | Wt.-average particle size [nm] | Solid content [mass %] | Coating coverage [μL] | Temp. [° C.] | Time [min] | Before transfer [μm] | After transfer [nm] | Before transfer [μm] | After transfer [μm] | Before transfer [%] | After transfer [%] | Before transfer [Ω/sq] | After transfer [Ω/sq] |
| Example 1 | 30 | 102 | 20 | 5 | 50 | 450 | 15 | 4-6 | 4-6 | 96-98 | 96-98 | 80 | 77 | 15 | 15 |
| Example 2 | 20 | 102 | 20 | 1 | 35 | 450 | 20 | 2-4 | 2-4 | 94-96 | 94-96 | 82 | — | 80 | — |
| Example 3 | 20 | 102 | 10 | 1 | 35 | 450 | 20 | 2-4 | 2-4 | 94-96 | 94-96 | 83 | 81 | 30 | 30 |
| Example 4 | 16 | 78 | 20 | 1 | 35 | 450 | 20 | 2-4 | 2-4 | 74-76 | 74-76 | 83 | — | 60 | — |
| Example 5 | 16 | 78 | 10 | 1 | 35 | 450 | 20 | 2-4 | 2-4 | 74-76 | 74-76 | 84 | 81 | 25 | 25 |
| Example 6 | 16 | 78 | 10 | 1 | 35 | 500 | 20 | 2-4 | — | 74-76 | — | 83 | — | 900 | — |
| Example 7 | 16 | 78 | 10 | 1 | 35 | 400 | 20 | 2-4 | 2-4 | 74-76 | 74-76 | 83 | 80 | 25 | 25 |
| Example 8 | 16 | 78 | 10 | 1 | 35 | 350 | 20 | 2-4 | — | 74-76 | — | 83 | — | 80 | — |
| Example 9 | 16 | 78 | 10 | 1 | 35 | 425 | 20 | 2-3 | — | 74-75 | — | 84 | — | 30 | — |
| Example 10 | 16 | 78 | 10 | 1 | 20 | 425 | 20 | 1-2 | — | 76-77 | — | 85 | — | 90 | — |
| Example 11 | 11 | 30 | 10 | 2 | 35 | 425 | 20 | 2 | — | 28 | — | 80 | — | 40 | — |
| Example 12 | 16 | 78 | 10 | 1 | 35 × 2 | 450 | 20 | 2-4 | 2-4 | 74-76 | 74-76 | 83 | 81 | 12 | 12 |
| Comp. Ex. 1 | — | — | — | — | — | — | — | 18 | | 250 | | 79 | | 0.11 | |
| Comp. Ex. 2 | — | — | — | — | — | — | — | 25 | | 220 | | 68 | | 0.03 | |
| Comp. Ex. 3 | — | — | — | — | — | — | — | 0.1 | | 2 | | 62 | | 0.1 | |
| Reference <Glass board> | | | — | | | — | | — | | — | | 91 | | $\geq 10^{10}$ | |
| Reference <PET film> | | | — | | | — | | — | | — | | 88 | | $\geq 10^{15}$ | |
| Example 13 | Microsieve (#250) Silica particle-fused | | 20 | 1 | 110 | 450 | 17.5 | 4.5 | | 97.5 | | | | 15 | |

| | Template (B) Stainless steel mesh | | Dispersion (D) Fine particle aqueous dispersion | | | | | Pattern | | | | | | | |
|---|---|---|---|---|---|---|---|---|---|---|---|---|---|---|---|
| | | | | | | Sintering conditions | | Line width | | Opening width | | Light transmittance | | Surface resistance value | |
| | Wire diameter [μm] | Pitch [μm] | Wt.-average particle size [nm] | Solid content [mass %] | Coating coverage [50 × 50 area] [μL] | Temp. [° C.] | Time [min] | Before transfer [μm] | After transfer [μm] | Before transfer [μm] | After transfer [μm] | Before transfer [%] | After transfer [%] | Before transfer [Ω/sq] | After transfer [Ω/sq] |
| Example 14 | 30 | 102 | 10 | 1 | 35 | 425 | 20 | 2-4 | 2-4 | 94-96 | 94-96 | — | 83 | — | — |
| Example 15 | 30 | 102 | 10 | 1 | 35 | — | — | 2-4 | — | 94-96 | — | 83 | — | — | — |
| Example 16 | 30 | 102 | 10 | 2 | 35 | 275 | 20 | 4-6 | — | 96-98 | — | 83 | — | 15 | — |
| Example 17 | 30 | 102 | 10 | 5 | 35 | 275 | 20 | 6-8 | — | 94-96 | — | 79 | — | 10 | — |

INDUSTRIAL APPLICABILITY

The conductive film of the invention has excellent transparency and conductivity, and therefore may be suitably used for purposes such as transparent electrodes for image display devices including plasma displays, liquid crystal displays, electric field discharge displays, electroluminescence displays and electronic paper; transparent electrodes for touch panels; transparent electrodes for solar cells; and electromagnetic wave shielding films.

EXPLANATION OF SYMBOLS

1 Substrate (A)
2 Template (B)
3 Substrate (E)
10 Surface treatment step
11 Conductive film-formed substrate (A)
20 Step of spreading dispersion (D) of conductive particles (P)
30 Drying step
31 Conductive member (product)
40 Step of coating monomer composition (X)
50 Polymerization (active energy beam irradiation) step

What is claimed is:

1. A method for producing a conductive film comprising:
   placing a template (B), having openings in a mesh structure running from the side that is to contact a substrate (A) through to the back side, on the surface of the substrate (A), and
   spreading a dispersion (D) of conductive particles (P) on the surface of the substrate (A) on which the template (B) has been placed, and drying it, thereby forming a mesh-like structure (C) of the conductive particles (P) near the points of contact between the substrate (A) and the template (B),
   and then removing the template (B) from the substrate (A) to form a mesh-like structure (C) of the conductive particles (P) on the surface of the substrate (A).

2. The method for producing a conductive film according to claim 1, which comprises supplying a dispersion (D) onto the template (B) after the template (B) has been placed on the surface of the substrate (A), and spreading it on the surface of the substrate (A).

3. A method for producing a conductive film, which comprises spreading a dispersion (D) of conductive particles (P) on the surface of a substrate (A),
   placing a template (B), having openings in a mesh structure running from the side that is to contact the substrate (A) through to the back side, over the dispersion (D) that has been developed on the surface of the substrate (A), and drying it, thereby forming a mesh-like structure (C) of the conductive particles (P) near the points of contact between the substrate (A) and the template (B), and then removing the template (B) from the substrate (A) to form a mesh-like structure (C) of the conductive particles (P) on the surface of the substrate (A).

4. The method for producing a conductive film according to any one of claims 1 to 3, which further comprises conductive treatment after formation of the mesh-like structure (C) of the conductive particles (P) on the surface of the substrate (A).

5. The method for producing a conductive film according to claim 4, wherein the conductive treatment is heating and sintering.

6. The method for producing a conductive film according to claim 1 or claim 3, which comprises forming a mesh-like structure (C) of the conductive particles (P) on the surface of the substrate (A) and subjecting the mesh-like structure (C) to additional electroplating.

7. A method for producing a conductive film, which comprises forming a mesh-like structure (C) by the method according to claim 1 or claim 3, and forming a resin layer on the surface of a substrate (A) and releasing the obtained resin layer from the substrate (A) to transfer the mesh-like structure (C) or its conductively treated product onto the surface of the resin layer.

8. A method for producing a conductive film, which comprises forming a mesh-like structure (C) by the method according to claim 1 or claim 3, and coating a monomer composition (X) or resin composition (Y) onto the surface of a substrate (A), placing a substrate (E) thereover, and then polymerizing (X) if (X) is used, to form a resin layer, and releasing the obtained resin layer from the substrate (A) to transfer the mesh-like structure (C) or its conductively treated product onto the surface of the resin layer.

9. A conductive film produced by the method according to claim 1 or claim 3.

10. A conductive film according to claim 9, having a fine pattern formed by a conductor on a substrate surface, the conductive film having the following features (a) to (c):
    (a) the fine pattern has a mesh structure;
    (b) the line width of the fine pattern is 0.5-6 µm; and
    (c) the shape of the cross-section of thin wires of the fine pattern has a segment structure that traces an ascending arc.

11. A conductive film according to claim 10, wherein the surface resistivity of the conductive film is not greater than 100 Ω/sq.

12. A conductive film obtained by transferring a conductive film according to claim 10 onto a flexible resin film or resin sheet, the conductive film having the following features (a) to (d):
    (a) the fine pattern of the conductor after transfer has a mesh structure;
    (b) the line width of the fine pattern of the conductor after transfer is 0.5-6 µm;
    (c) the light transmittance of the conductive film is 77% or greater; and
    (d) the surface resistivity of the conductive film is not greater than 100 Ω/sq.

* * * * *